US009994440B2

United States Patent
Jenkins et al.

(10) Patent No.: US 9,994,440 B2
(45) Date of Patent: Jun. 12, 2018

(54) MEMS DEVICE AND PROCESS

(71) Applicant: Cirrus Logic International Semiconductor Ltd., Edinburgh (GB)

(72) Inventors: Colin Robert Jenkins, Livingston (GB); Tsjerk Hoekstra, Balerno (GB); Scott Cargill, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days. days.

(21) Appl. No.: 14/902,641

(22) PCT Filed: Jun. 30, 2014

(86) PCT No.: PCT/GB2014/051985
§ 371 (c)(1),
(2) Date: Jan. 4, 2016

(87) PCT Pub. No.: WO2015/001325
PCT Pub. Date: Jan. 8, 2015

(65) Prior Publication Data
US 2016/0167946 A1    Jun. 16, 2016

(30) Foreign Application Priority Data

Jul. 5, 2013 (GB) .................................. 1312150.4

(51) Int. Cl.
*H01L 21/00* (2006.01)
*B81B 3/00* (2006.01)
(Continued)

(52) U.S. Cl.
CPC .......... *B81B 3/0072* (2013.01); *B81B 7/0061* (2013.01); *H04R 19/005* (2013.01);
(Continued)

(58) Field of Classification Search
CPC ........... H01L 21/0203; H01L 21/02527; H01L 21/3063; H01L 21/67086; H01L 21/67326;
(Continued)

(56) References Cited

U.S. PATENT DOCUMENTS 5,870,482 A    2/1999 Loeppert et al.
2010/0020991 A1    1/2010 Chen
(Continued)

FOREIGN PATENT DOCUMENTS

| CN | 102452635 A | 5/2012 | |
|---|---|---|---|
| EP | 2579616 A1 * | 4/2013 | ........... H04R 19/005 |
| JP | 2001518246 A | 10/2001 | |

OTHER PUBLICATIONS

Zou, Quanbo et al., Design and Fabrication of Silicon Condenser Microphone Using Corrugated Diaphragm Technique, Journal of Microelectromechanical Systems, IEEE Service Center, U.S., vol. 5, No. 3, Sep. 1, 1996, pp. 197-204.
(Continued)

*Primary Examiner* — Julio J Maldonado
*Assistant Examiner* — Rodolfo D. Fortich
(74) *Attorney, Agent, or Firm* — Jackson Walker L.L.P.

(57) ABSTRACT

The application describes improvements to (MEMS) transducers (100) having a flexible membrane (301) with a membrane electrode (302), especially where the membrane is crystalline or polycrystalline and the membrane electrode is metal or a metal alloy. Such transducers may typically include a back-plate having at least one back-plate layer (304) coupled to a back-plate electrode (303), with a plurality of holes (314) in the back-plate electrode corresponding to a plurality back-plate holes (312) through the back-plate. In embodiments of the invention the membrane electrode has at least one opening (313) in the membrane
(Continued)

electrode wherein, at least part of the area of the opening corresponds to the area of at least one back-plate hole, in a direction normal to the membrane, and there is no hole in the flexible membrane at said opening in the membrane electrode. There may be a plurality of such openings. The openings effectively allow a reduction in the amount of membrane electrode material, e.g. metal, that may undergo plastic deformation and permanently deform the membrane. The openings are at least partly aligned with the back-plate holes to minimize any loss of capacitance.

21 Claims, 8 Drawing Sheets

(51) Int. Cl.
    *H04R 19/00* (2006.01)
    *B81B 7/00* (2006.01)
    *H04R 19/04* (2006.01)
    *H04R 7/10* (2006.01)

(52) U.S. Cl.
    CPC ...... *H04R 19/04* (2013.01); *B81B 2201/0257* (2013.01); *B81B 2201/0264* (2013.01); *B81B 2203/0127* (2013.01); *B81B 2203/04* (2013.01); *H04R 7/10* (2013.01); *H04R 2201/003* (2013.01)

(58) Field of Classification Search
    CPC ......... H01L 21/67781; H01L 21/68721; H01L 21/68771; H01L 21/7687; H01L 21/76898
    USPC .................. 257/416, 415, 418, 419, 254
    See application file for complete search history.

(56) References Cited

U.S. PATENT DOCUMENTS

| | | | |
|---|---|---|---|
| 2010/0074458 | A1 | 3/2010 | Lan et al. |
| 2010/0212432 | A1* | 8/2010 | Kasai ................ H04R 19/005 73/654 |
| 2011/0316100 | A1* | 12/2011 | Kim .................. B81C 1/00158 257/416 |
| 2012/0090398 | A1 | 4/2012 | Lee et al. |

OTHER PUBLICATIONS

International Search Report and Written Opinion, International Application No. PCT/GB2014/051985, dated Sep. 29, 2014, 13 pages.
Combined Search and Examination Report, Application No. GB1312150.4, dated Jan. 21, 2014, 5 pages.
Examination Report of the TIPO, Taiwan Patent Application No. 103123089, dated Aug. 29, 2017.

\* cited by examiner

MEMS DEVICE AND PROCESS

This invention relates to micro-electro-mechanical system (MEMS) devices and processes, and in particular to MEMS transducers and methods of fabrication, especially a MEMS capacitive microphone.

Various MEMS devices are becoming increasingly popular. MEMS transducers, and especially MEMS capacitive microphones, are increasingly being used in portable electronic devices such as mobile telephones and portable computing devices.

Some transducers formed using MEMS fabrication processes comprise a flexible membrane with one electrode for read-out/drive deposited on the membrane and another electrode supported in spaced relation to the membrane electrode in a transverse direction, typically supported on a structural layer referred to as a back-plate. In the case of MEMS pressure sensors and microphones, read out is usually accomplished by measuring the capacitance between the electrodes. The membrane is moved by air pressure differences which causes the flexible membrane to move relative to the fixed back-plate and thus vary the capacitance.

FIGS. 1a, and 1b show a cross section and perspective view, respectively, of a known capacitive MEMS microphone device 100 and FIG. 1c shows a plan view of the membrane and membrane electrode thereof. The capacitive MEMS microphone device 100 comprises a membrane layer 101 which forms a flexible membrane which is free to move in response to pressure differences generated by sound waves. A membrane electrode 102 is mechanically coupled to the flexible membrane 101 to form a first capacitive plate of the capacitive microphone device. A back-plate electrode 103, which is mechanically coupled to a generally rigid structural layer referred to as a back-plate layer 104, forms a second capacitive plate of the capacitive microphone device. In the example shown in FIG. 1a the back-plate electrode 103 is embedded within the back-plate structure 104 although other arrangements are possible, for instance where the back-plate electrode 103 is mechanically attached to a surface of the back-plate structure 104 in a traverse direction relative to the membrane electrode 102.

In some applications, the microphone 100 may be arranged in use such that incident sound is received via the back-plate 104. In such embodiments a plurality of holes 112, hereinafter referred to as acoustic holes, are arranged in the back-plate 104 so as to allow free movement of air molecules, such that the sound waves can enter a cavity 110 between the membrane 101 and back-plate 104. On the other side of the membrane a further cavity 109, between the membrane and substrate, in association with a substrate cavity 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of acoustic holes to allow air to freely move between the second cavity and a further volume above the back-plate. In this case the substrate cavity serves as a front volume and the further volume serves as a back volume.

In use, in response to a pressure wave incident on the microphone 100, the membrane 101 is deflected from its equilibrium or quiescent position. The distance between the membrane electrode 102 and the back-plate electrode 103 is correspondingly altered, giving rise to a change in capacitance between the two electrodes 102 and 103 that is subsequently detected by electronic circuitry (not shown). Bleed holes 111 through the membrane 101 allow the pressure in the cavities 108/109 and 110 to equalise over relatively long timescales (in acoustic frequency terms) which reduces the effect of low frequency pressure variations, e.g. arising from temperature variations and the like, but without impacting on sensitivity at the desired acoustic frequencies.

In some MEMS microphones the flexible membrane layer 101 is a thin layer of crystalline or polycrystalline material, although it may be formed in practice by several layers of material which are deposited in successive steps. The flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 in such microphones is typically a thin layer of metal, e.g. aluminium, which, as illustrated in FIG. 1c, is located in the centre of the membrane 101, i.e. that part of the membrane which displaces the most. It will be appreciated by those skilled in the art that the membrane electrode may be formed by an alloy such as aluminium-silicon for example. The membrane electrode may, for example, cover approximately 40% of the central area of the membrane. One problem with such a material system however is that the metal of the membrane electrode 102 may undergo some plastic deformation with relatively high or repeated displacement, i.e. the metal of the membrane electrode may be deformed so it will not return to exactly the same starting position. Since the flexible membrane 101 and the membrane electrode 102 are mechanically coupled to one another this can lead to an overall change in the quiescent position of the flexible membrane 101 and/or a change in the stress properties of the overall membrane 101/102.

Typically the membrane layer 101 and membrane electrode 102 may be fabricated so as to be substantially planar in the quiescent position, i.e. with no pressure differential across the membrane, as illustrated in FIG. 1 a. The membrane layer may be formed so as to be substantially parallel to the back-plate layer in this quiescent position, so that the membrane electrode 102 is parallel to the back-plate electrode 103. As mentioned however due the properties of the metal membrane electrode 102 the overall membrane 101/102 may, over time, become permanently deformed from this quiescent configuration.

FIG. 2 illustrates the permanent deformation which can occur to the quiescent position, illustrated by the dashed line, of the membrane 101/102. Through use, the metal electrode 102 has been plastically deformed leading to a change in stress distribution and warping of the whole membrane structure 101/102.

It can be seen that the membrane electrode 102 in its quiescent position thus has a different spacing from the back-plate electrode 103 from the original quiescent position immediately after manufacture. This can lead to a DC offset in the measurement signal from such a transducer as the capacitance at the quiescent position is not the same. In addition this deformation may lead to change in the stress characteristics of the overall membrane 101/102, which affects how the membrane 101/102 reacts to a given signal level which can lead to a change in sensitivity.

SUMMARY

Embodiments of the present invention relate to MEMS devices and processes that at least mitigate some of the disadvantages mentioned above.

Thus according to an aspect of the present invention there is provided a micro-electrical-mechanical system (MEMS) transducer, comprising: a flexible membrane; a membrane electrode coupled to said flexible membrane; and a back-plate, comprising at least one back-plate layer coupled to a back-plate electrode, having a plurality of holes in the back-plate electrode corresponding to a plurality back-plate holes through the back-plate; wherein said membrane electrode comprises at least one opening in the membrane electrode wherein, at least part of the area of said opening corresponds to the area of at least one back-plate hole, in a direction normal to the membrane, and there is no hole in the flexible membrane at said opening in the membrane electrode.

The area of each of the holes in the back-plate electrode may be greater than the area of each of said plurality of back-plate holes.

The flexible membrane may comprises a crystalline or polycrystalline material, such as silicon nitride. The flexible membrane may have intrinsic stress. The membrane electrode may comprise metal or a metal alloy, such as aluminium, possibly with silicon.

There may be a plurality of openings in the membrane electrode where, for each of said plurality of openings in the membrane electrode, at least part of the area of said opening corresponds to the area of at least one back-plate hole, in a direction normal to the membrane, and there is no hole in the flexible membrane at said opening in the membrane electrode. At least some of said plurality of openings in the membrane electrode may comprise a hole in said membrane electrode. At least some of said plurality of openings in the membrane electrode may be substantially the same shape and/or substantially the same size as at least some of said plurality of holes in the back-plate electrode.

The area at least some of said plurality of openings in the membrane electrode may align with the area of at least some of said plurality of holes in the back-plate electrode, in a direction normal to the membrane. The area of at least some of said plurality of openings in the membrane electrode may be greater than the area of at least some of said plurality of holes in the back-plate electrode and/or the area of at least some of said plurality of openings in the membrane electrode are smaller than the area of at least some of said plurality of holes in the back-plate electrode. The width of at least some of said plurality of openings in the membrane electrode may differ from the width of at least some of said plurality of holes in the back-plate electrode by up to 2 microns.

At least one of said plurality of openings in the membrane electrode may be generally circular in shape and/or at least one of said plurality of openings in the membrane electrode may be non-circular in shape.

In some instances at least one of said plurality of openings in the membrane electrode is not completely bounded by electrode material. The distribution of the plurality of openings in the membrane electrode may be configured to provide even stress as the membrane flexes.

In some embodiments less than 20% of the stress in the flexible membrane-membrane electrode structure is due to said flexible membrane and/or less than 25% of the surface area of said flexible membrane is covered by electrode material. The outer perimeter of the electrode may enclose an area of membrane greater than 35% of the area of said membrane.

The membrane electrode may have a thickness of no greater than 100 nm.

The transducer may be a capacitive transducer and/or may be a microphone. The transducer may be packaged within a housing. In one embodiment the package may comprise: a substrate comprising a plurality of layers, with at least one layer comprising a conductive material and at least one layer comprising a non-conductive material wherein the MEMS transducer is electrically coupled to the substrate. There may be a plurality of electrical connections for electrically coupling the MEMS transducer to circuitry external to the package. The package may also have a cover mechanically coupled to the substrate wherein the MEMS transducer is enclosed within the volume created by the substrate and said cover; and a port for enabling signals to stimulate the MEMS transducer.

The MEMS transducer may be connected to an integrated circuit for read-out and/or drive of said transducer.

The MEMS transducer may be used in an audio device which may be at least one of: a portable device; a communications device; a computing device; a battery powered device; an audio player; a video player; a gaming device; a mobile telephone; a laptop, notebook or tablet computer.

The invention also provides a method of fabricating a micro-electrical-mechanical system (MEMS) transducer comprising:

forming at least one membrane layer coupled to a membrane electrode to provide a flexible membrane in use;

forming at least one back-plate layer coupled to a back-plate electrode to provide a rigid back-plate in use having a plurality of back-plate holes through the at least one back-plate layer and back-plate electrode;

wherein forming at least one membrane layer coupled to a membrane electrode comprises forming a membrane electrode having at least one opening, wherein at least part of the area of said opening corresponds to the area of at least one back-plate hole, in a direction normal to the membrane, and there is no hole in the flexible membrane at said opening in the membrane electrode.

Forming the membrane electrode may comprise depositing a layer of membrane electrode material and patterning said layer of membrane electrode to provide said at least one opening.

In a further aspect there is provided a micro-electrical-mechanical system (MEMS) transducer, comprising: a flexible membrane; and an electrode coupled to said flexible membrane; wherein said electrode comprises a plurality of openings in the electrode wherein there is no hole in the flexible membrane at said openings in the electrode.

A further aspect provides a micro-electrical-mechanical system (MEMS) transducer, comprising: a flexible membrane comprising a first material; and a membrane electrode coupled to said flexible membrane comprising a second material; wherein the area of the first material within the outer boundary of the membrane electrode is greater than the area of the second material within the outer boundary of the membrane electrode.

The first material may occupy the whole of the area within the outer boundary of the membrane electrode.

In another aspect there is provided a micro-electrical-mechanical system (MEMS) transducer, comprising: a membrane comprising at least one flexible membrane layer and a membrane electrode; and a back-plate having a plurality of acoustic holes therein; wherein said membrane electrode has a plurality of openings that at least partly align with said acoustic holes and which do not form part of a hole through the membrane.

In a further aspect there is provided a micro-electrical-mechanical system (MEMS) transducer, comprising: a flexible membrane; a back-plate; comprising at least one acoustic hole, wherein said flexible membrane and said back-plate are spaced in relation to one another in a first direction which is substantially normal to the plane of said flexible membrane; and a membrane electrode coupled to said flexible membrane, wherein there is at least one area of absence of electrode material within said electrode which corresponds to said at least one acoustic hole, in a direction normal to the membrane.

The invention further provides a micro-electrical-mechanical system (MEMS) transducer, comprising: a flexible membrane; a membrane electrode coupled to said flexible membrane, wherein said membrane electrode has a plurality of membrane electrode openings; and a back-plate in spaced relation to said flexible membrane; said back-plate having a plurality of back-plate holes; wherein said plurality of membrane electrode openings and said plurality of back-plate holes are located in substantially the same place and are substantially the same size.

In a further aspect there is provided a micro-electrical-mechanical system (MEMS) transducer, comprising: a flexible membrane; and an electrode coupled to said flexible membrane; wherein said electrode is patterned with a plurality of openings.

The electrode may be patterned with said openings to reduce creep and/or stress relaxation of the electrode.

DRAWINGS

The invention will now be described by way of example only, with reference to the accompanying drawings, of which:

DETAILED DESCRIPTION

Figure 1A:
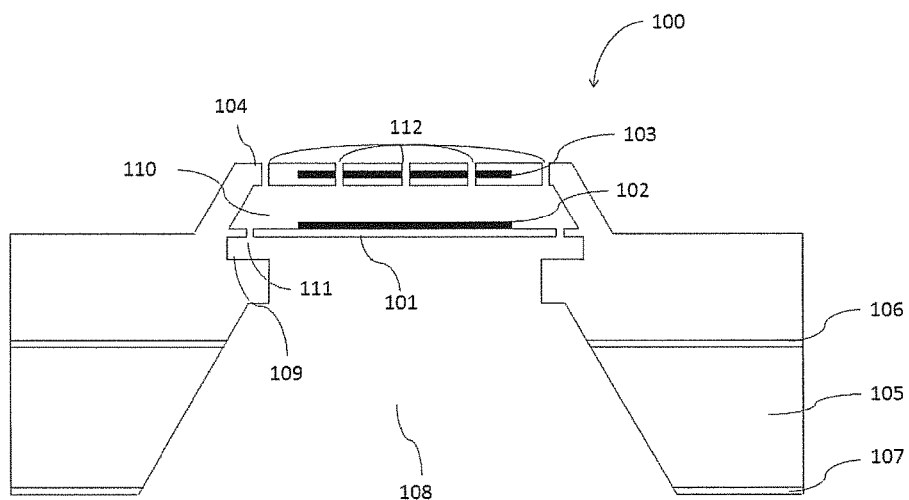
FIGS. 1a, 1b and 1c illustrate known MEMS transducers in device section, plan views and membrane plan views.

This invention will be described in relation to a MEMS transducer in the form of a MEMS capacitive microphone. It will be appreciated, however, that the invention is equally applicable to other types of MEMS transducers including capacitive-type transducers.

As mentioned above for MEMS sensors having a metal membrane electrode provided on a flexible membrane layer, especially a membrane layer which is a crystalline material, plastic deformation of the metal in use may mean that the quiescent position of the membrane and/or stress characteristics can change overtime with use. This can result in an unwanted DC offset and/or a change in sensitivity of the sensor and the subsequent quality of the acoustic signal being reproduced may be significantly degraded.

Typically the membrane electrode is relatively thin, for example of the order of about 60 nm or so, and using a thinner membrane electrode layer may not be possible or practical for conventional MEMS processes. Using a smaller diameter electrode on the membrane would reduce the amount of metal to undergo plastic deformation but would also result in a loss of sensitivity—as capacitance is linked to electrode area. This is undesirable, especially as the capacitance of a MEMS sensor is relatively low anyway.

Embodiments of the present invention relate to micro-electrical-mechanical system (MEMS) transducers comprising a membrane electrode coupled to a flexible membrane, and a back-plate comprising at least one back-plate layer coupled to a back-plate electrode, where the back-plate has a plurality of back-plate holes through the back-plate. The flexible membrane and the back-plate may be supported in spaced relation to one another so as to be substantially parallel (at the quiescent position). In embodiments of the present invention the membrane electrode comprises at least opening wherein, at least part of the area of the opening corresponds to the area of a back-plate hole in a direction normal to the membrane. In other words the area of at least part of the opening in the membrane electrode aligns (in a direction normal to the membrane) with at least part of the area of a back-plate hole. In embodiments of the invention there is no hole in the flexible membrane at said opening in the membrane electrode, i.e. the flexible membrane may be continuous in the area of the opening in the membrane electrode and the area of the membrane electrode is not part of a hole through the entire membrane. In some embodiments there may be a plurality of such openings in the membrane electrode.

The openings in the membrane electrode are areas devoid of substantially any material of the membrane electrode, and thus may form cavities, apertures or holes in the membrane electrode material, e.g. the metal. By providing such openings in the membrane electrode, the total amount of metal forming the membrane electrode can be reduced compared to a membrane electrode having a similar size diameter but without any such openings, i.e. the membrane electrode having the openings provides less coverage of the flexible membrane.

As previously stated the openings in the membrane electrode do not necessarily correspond to holes in the membrane and thus the openings can be seen as an area of absence of electrode material (but at least partly bounded by electrode material), where there is still continuous material of the flexible membrane, i.e. there is a hole in the membrane electrode material only and not the flexible membrane.

The openings in the membrane electrode may preferably be arranged so that these openings, i.e. the areas of absence of membrane electrode material, are at least partly aligned with the holes in the back-plate, e.g. acoustic holes. As the acoustic holes are present throughout the whole back-plate, at least some of the acoustic holes in the back-plate correspond, whether in whole or in part, to holes in the back-plate electrode, i.e. areas of absence of back-plate electrode. The openings in the membrane electrode and the holes in the back-plate electrode are aligned, partially or wholly, in a traverse direction, i.e. a direction normal to the membrane. As used herein the term normal to the membrane shall mean a direction which is substantially normal to the plane defined by the bound edges of the membrane. Obviously in use the membrane may deflect and the direction of the local normal to part of the membrane may vary, but the direction normal to the whole membrane can still be seen as the direction normal to the plane of including the fixed edges of the membrane.

Figure 1B:
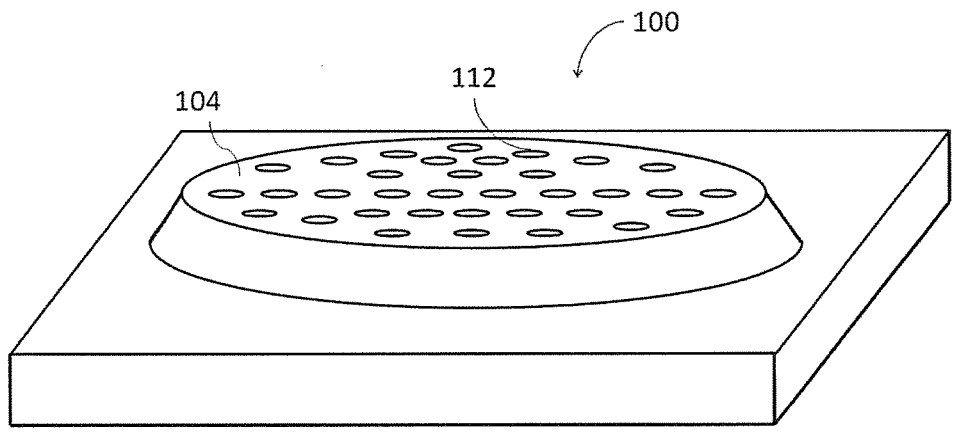
Figure 1C:
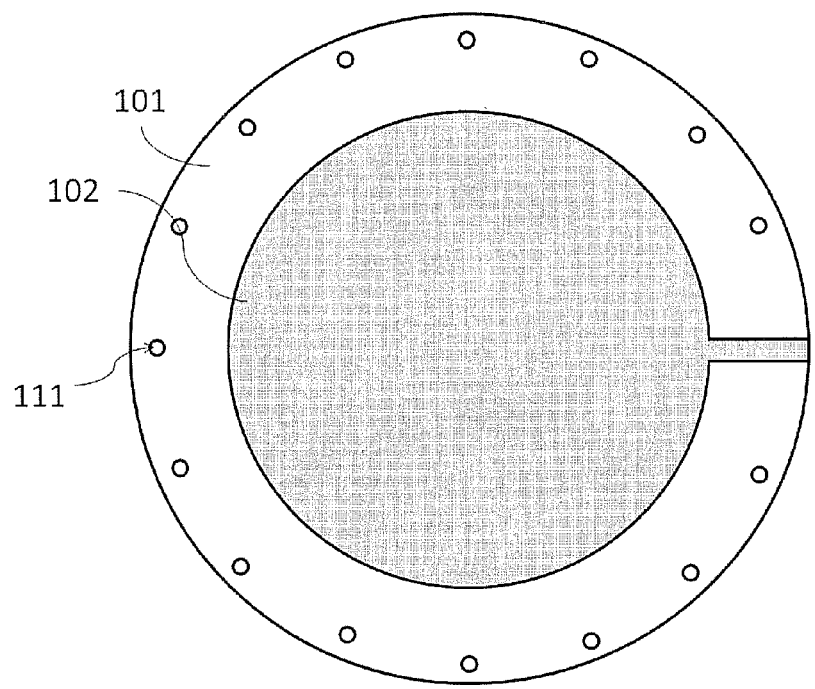
Figure 2:
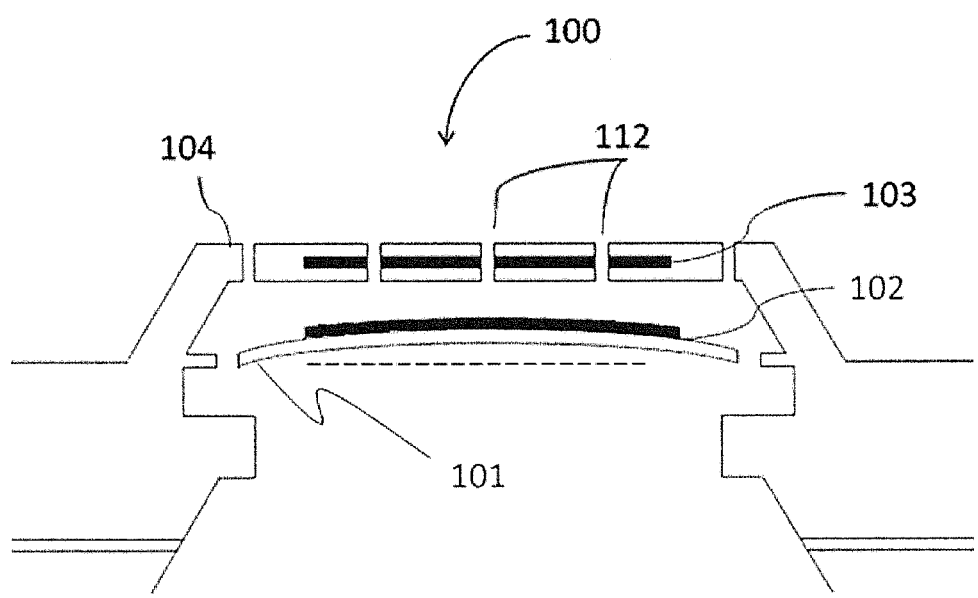
FIG. 2 illustrates how a membrane may be plastically deformed.

In a MEMS capacitive sensor the capacitance developed between the back-plate electrode and membrane electrode will depend on the separation between the electrodes and also the area of the electrodes. It will be appreciated that the presence of the acoustic holes in the back-plate clearly means that there are a plurality of holes in the back-plate electrode. Thus, for a continuous membrane electrode such as illustrated in FIGS. 1a and 1c, there will be areas of membrane electrode which are located, in a direction normal to the membrane, in the location of an acoustic hole in the back-plate.

As one skilled in the art will appreciate in a parallel plate capacitor which is charged/biased there will be an electrostatic field component running from one plate to the other in a direction perpendicular to the plates. However in the areas of the acoustic holes there is no back-plate electrode and thus no perpendicular field component. Embodiments of the present invention therefore provide openings in the membrane electrode in locations that generally correspond to the location of the holes in the back-plate and hence the back-plate electrode, in other words in areas such that the area of a back-plate hole overlaps, at least partly, with the area of an opening in the back-plate electrode. In such areas there would be no perpendicular field component, even if there were membrane electrode material present, because of the absence of back-plate electrode. Providing openings in the membrane electrode in such areas may therefore have a limited impact on the resulting capacitance of the sensor and hence on sensitivity of the sensor.

The advantage of having such openings in the membrane electrode is that less membrane electrode material can be used than otherwise would be the case, but without any significant detriment to the resulting capacitance. The result of less membrane electrode material, e.g. metal, being formed on the flexible membrane results in the amount of material that is susceptible to plastic deformation being reduced and the proportion of membrane material to electrode material being increased. Thus the resulting complete membrane structure is less likely to be deformed plastically with the attendant disadvantages, but without sacrificing sensitivity or signal to noise ratio.

In addition the openings in the membrane electrode can effectively break up the overall area of the membrane electrode into smaller areas. In other words the maximum continuous extent of membrane electrode in any direction may be relatively low because of the openings (and reduced compared to a membrane electrode without openings). For example consider that the openings comprise an array of holes in the membrane electrode. Between the holes may be narrow sections of membrane electrode. Narrower sections of metal may provide a better response to elongations, in terms of being less likely to deform the underlying membrane, than wider sections. Thus patterning the membrane electrode with openings can be advantageous not just in reducing the overall amount of membrane electrode but also providing a membrane electrode pattern that is less likely to result in deformation to the flexible membrane. Patterning of the membrane electrode with openings can therefore to reduce stress relaxation/creep, i.e. reduce the impact of metal creep.

This is particularly advantageous where the flexible membrane comprises a crystalline or polycrystalline material, such as one or more layers of silicon-nitride $Si_3N_4$ and the membrane electrode comprises a metal, such as aluminium, titanium, gold or copper, or alloys thereof. In such material systems the flexible membrane layer may be formed so as to have a desired intrinsic stress and any plastic deformation of the membrane electrode may alter the response of the sensor.

A more exact explanation and analysis would include the effect of non-perpendicular fringing electrostatic fields that extend from the edge of a hole in the back-plate electrode to any membrane electrode area that corresponds to the area of the acoustic hole. However such fringing fields may only extend laterally for about 1-2 µm and the area of the acoustic holes may be much larger, for example of the order of about 10 µm or so in diameter, so this effect does not materially affect the argument.

It will therefore be appreciated that in embodiments of the invention the acoustic holes in the back-plate and the back-plate electrode correspond to the openings in the membrane electrode. By correspond it is meant that the position of the openings in the membrane will be substantially the same as the position of the holes in the back-plate electrode as viewed from a direction normal to the membrane (or back-plate electrode). Therefore were the areas of the acoustic holes to be projected onto the membrane in such a direction, the areas of the projected holes would at least partly map on to the area of the openings in the membrane electrode.

The sizes of the openings in the membrane electrode and acoustic holes in the back-plate, or more particularly the holes in the back-plate electrode, could, in some embodiments, be substantially the same size and possibly also the same shape. Thus the openings in the membrane electrode could correspond in size and location to the holes in the back-plate (or holes in the back-plate electrode). However the sizes and/or shape of the membrane openings and back-plate holes do not need to be same (and one could be several factors larger than the other), however, they still could correspond in terms of location, and in this sense, for example, several openings could underlie one hole.

Embodiments of the invention thus provide a plurality of openings in the membrane electrode which, at least partly, align with holes in the back-plate and hence holes in the back-plate electrode and which do not form part of a hole in the membrane. It will be appreciated however that there may, in addition, be other openings in the membrane electrode which do not align with any back-plate hole and/or which do form part of a hole through the membrane. For instance there may be one or more bleed holes, or other pressure relief hole, through the membrane and some may be provided in the area of the membrane electrode.

Figure 3:
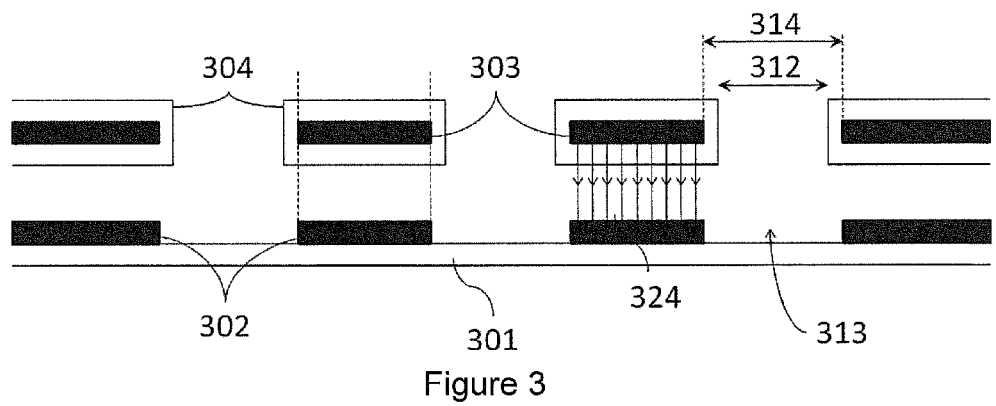
FIG. 3 illustrates openings in a membrane electrode according to an embodiment of the invention.

FIG. 3 illustrates one embodiment of the present invention. FIG. 3 shows a membrane electrode 302 formed on a flexible membrane 301. The membrane electrode 302 has a plurality of openings 313 in the electrode material 302 where there is no coverage of the membrane 301. These openings (or areas of absence) 313 reduce the amount of electrode material 302 which is deposited on the membrane 301 (for a given diameter of electrode) and therefore increases proportion of membrane material to electrode material compared to the electrode without such openings. This in turn will lead to a membrane structure 301/302 which has reduced plastic deformation. In use this structure will 301/302 deform less and this improve the operation of the MEMS transducer 100 compared to a membrane electrode without openings.

FIG. 3 also shows the back-plate 304 and back-plate electrode 303 which have acoustic holes 312 through them.

These acoustic holes 312 allow acoustic communication between the cavity between the membrane and back-plate and a volume on the other side of the membrane (which could be a sound port or a back-volume). The acoustic holes 312 extend through both the back-plate 304 and the back-plate electrode 303, and thus there are holes through the entire back-plate structure 303/304. It should be noted the holes 314 in back-plate electrode 303 may have the same dimensions as the acoustic hole 312 to which they correspond but this is not always the case and the holes 314 in the back-plate electrode 303 could be larger as illustrated, for instance so that no back-plate electrode material 303 is exposed in the side wall of the acoustic holes 312.

In the embodiment shown in FIG. 3 the holes 314 in the back-plate electrode 303 directly overlay the openings 313 in the membrane electrode 301. In other words the size and location of the openings 313 in the membrane electrode 302 substantially correspond (at the quiescent position) to the size and location of the holes 314 in the back-plate electrode 303. This means that (at quiescent position) for substantially any area where there is any membrane electrode 302 there is also overlying back-plate electrode 303 (assuming the overall size and location of the perimeter of the back-plate electrode 303 at least matches that of the membrane electrode 302). However for any area within an opening 313 in the membrane electrode 302 there may be no overlying back-plate electrode 303.

In use, an electric field is generated between the back-plate electrode 303 and the membrane electrode 302. This field may comprise a linear field component 324 running from one electrode to another in a direction perpendicular to the electrodes (note only one section of linear field component 324 is shown in FIG. 3 for clarity). In addition fringe field components (not illustrated) may also occur, bowing into the space between the acoustic holes 312 and the openings 313 in the membrane electrode 302.

In the case of a parallel plate capacitor, the linear field component 324 will extend from one plate to another in a direction perpendicular to the plates, forming equipotential surfaces. This produces a uniform electric field which capacitively couples the two plates 302, 303 to one another. The arrangement shown in FIG. 3 ensures that membrane electrode material 302 is generally provided in areas where there could be a linear field component 324 but is generally omitted in areas where there may be no linear field component 324. Such an arrangement can significantly reduce the amount of membrane electrode material 302 provided on the flexible membrane layer 301 but without a significant decrease in capacitance.

It will of course be appreciated that a membrane electrode 302 will normally be deposited in the central part of the membrane 301 only. Thus there may be acoustic holes 312 in the back-plate 303/304 which would not, in any case, overlap any membrane electrode 302. If the back-plate electrode 303 is larger than the membrane electrode 302 there may also be holes 313 in the back-plate electrode which would not, in any case, overlap any membrane electrode 302. It will be understood that the openings 313 in the membrane electrode 302 are areas that are at least partly bounded by membrane electrode material 302.

In one embodiment openings 313 may be provided in the membrane electrode 302 such that the majority of holes 312 in the back-plate electrode 303/304 that lie within a central area corresponding to the outer perimeter of the membrane electrode 302 have an associated opening 313 in membrane electrode 302. In other words there may only be a relatively small proportion of holes in the back-plate electrode 312 which correspond to a location on the membrane electrode 302 where there is no opening. As will be described below this can significantly reduce the extent of coverage of the membrane electrode 302 compared to an electrode without any openings.

It should be noted that the embodiment shown in FIG. 3 illustrates that the flexible membrane 301 does not contain any holes corresponding to the openings 313 in the membrane electrode 302, i.e. the material, silicon nitride for example, of the flexible membrane 301 is continuous in the area of the openings 313 in the membrane electrode 302. In some MEMS sensors there may be holes through the membrane structure. As discussed above in respect of FIG. 1, bleed holes 111 may be provided for low-frequency pressure equalisation and whilst such bleed holes 111 are typically located outside the area of membrane 301 coupled to the membrane electrode 302 this is not necessarily the case and there could be bleed holes 111, or other holes through the membrane electrode 302 and flexible membrane layer 301. Such holes through the entire membrane structure 302/303 will thus provide openings in the membrane electrode 302 but only in combination with a hole in the membrane layer 301. Further any such holes through the membrane 302/303 may not be specifically aligned with back-plate holes 312. Any holes through the membrane electrode corresponding to bleed holes, or other holes, through the entire membrane structure will thus be in addition the openings in the membrane electrode described above.

It should also be noted that even though there is no material of the membrane electrode 302, e.g., metal or alloy, within the openings 313 such openings do not have to be void of any material. For example there could be an additional membrane layer on top of the membrane layer 301 which at least partly fills the opening 313 in the membrane electrode 302. Additionally, or alternatively, the openings 313 could be at least partly filled with a dielectric material.

Figure 4A:
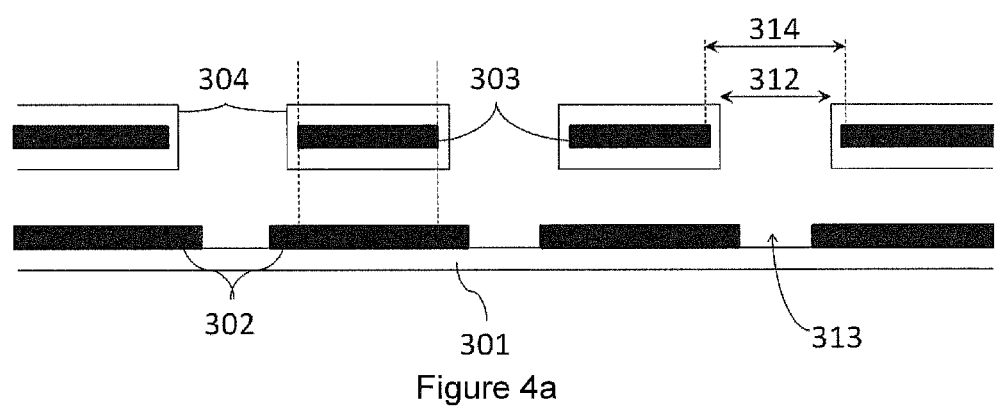
FIGS. 4a and 4b illustrate openings in a membrane electrode according to further embodiments of the invention.
Figure 4B:
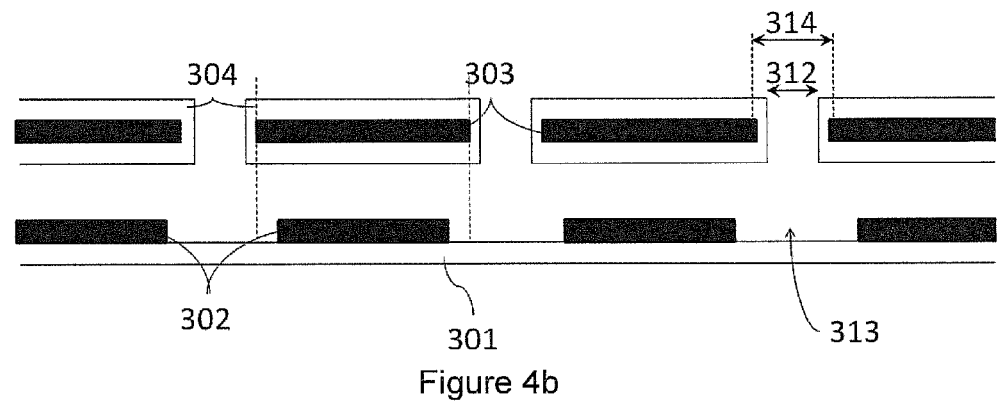

FIGS. 4a and 4b illustrate two other possible embodiments in which the openings 313 of the membrane electrode 301 still correspond to the acoustic holes 312 through the back-plate 304 and the second electrode 303, however the pattern of acoustic holes 312 in the back-plate electrode 303 does not exactly map on to the pattern of openings 313 in the membrane electrode 302.

In both the embodiments shown in FIGS. 4a and 4b there is a degree of overlap between the membrane electrode 302 and back-plate electrode 303 providing electrode areas that will, in use, have a linear field 324 between them. In the embodiments of FIGS. 4a and 4b there is at least some area of membrane electrode 302 that is not overlapped by back-plate electrode 303 or vice versa. These 'non-overlapped' areas of either electrode 302/303 can still contribute to the capacitance of the device through fringe fields which will extend from the edge of one electrode to at least some of the non-overlapped portion of the other electrode.

FIG. 4a illustrates an embodiment wherein the width of the openings 313 in the membrane electrode 302 is smaller than the width of the openings 314 through the back-plate electrode 303, in other words the openings 313 in the membrane electrode 302 are smaller than the opening 312 in the back-plate 304 and the opening 314 in the back-plate electrode 303. In this embodiment, in addition to the linear field component 324 between the back-plate electrode 303 and the membrane electrode 302, in use there may also be fringing field components (not illustrated) between the edge of the back-plate electrode 303 and at least some parts of the membrane electrode 302 within the area of the holes 312/314 in the back-plate electrode 303. Typically such fringing fields may extend in practice for at about 1-2 microns in a lateral direction. Thus the openings 313 in the membrane electrode 302 may have a diameter which is smaller than that of the holes 314 in the back-plate electrode 303 by an amount in the region of up to 2 microns, say 1-2 microns. In such an embodiment there may be potentially no drop in sensitivity compared to an electrode having no openings as the total area of membrane electrode which contributes to the capacitance may be substantially the same in each case. In other words, any electrode material 303 disposed within an area inside about 2 microns from the edge of the hole 314 in the back-plate electrode 303 may not contribute significantly to the capacitance in any case.

FIG. 4b shows an alternative embodiment where the width of the openings in the membrane electrode 313 is greater than the width of the holes 314 through the back-plate electrode 303. This embodiment therefore provides larger openings than that shown in FIG. 3 (for a given size of holes in the back-plate electrode) and thus this embodiment provides a membrane electrode 302 with even less membrane electrode material. This will further decrease the likelihood that the overall membrane would be plastically deformed or the extent of any plastic deformation. The difference between the width of the openings in the membrane electrode 302 and holes 314 in the back-plate electrode 303 may again be of the order of 1-2 microns, and similarly to the embodiment in FIG. 4a, fringe fields (not illustrated) will extend from the non-overlapped back-plate electrode 303 to the membrane electrode 302.

Figure 5:
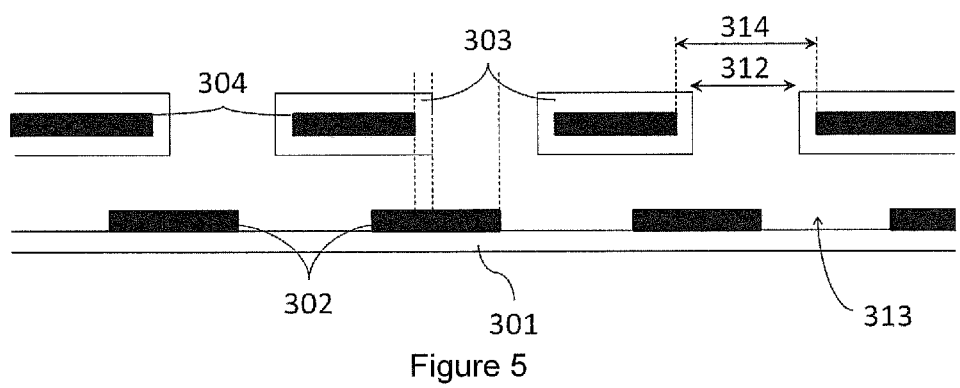
FIG. 5 illustrates the openings in the electrode membrane being in an offset configuration according to an embodiment of the invention.

In the embodiments described with reference to FIGS. 3 and 4a and 4b the openings 313 in the membrane electrode 302 are substantially centred on the centre of the holes 314 in the back-plate electrode 303. In some embodiments however the openings 313 in the membrane electrode 302 may be offset with respect to the holes 314 in the back-plate electrode 303 (whether or not the openings 313 in the membrane electrode 302 are the same or a different size to the holes 314 in the back-plate electrode 303) as illustrated in FIG. 5. Of course other arrangements are possible. In some embodiments it may be desired to pattern the voids 313 in the membrane electrode 301 in a particular way, for instance to achieve a desired stress distribution, which results in an offset between the openings 313 in the membrane electrode 302 and the holes 314 in the back-plate electrode 303 and/or there may be a desire to offset the openings from the holes in the quiescent position so that there is a preferred alignment when the membrane 301/302 is deflected by an incident pressure wave.

It should be noted that the size of the openings and/or the alignment of the openings with respect to the holes in the back-plate electrode may vary across the membrane electrode. Thus in one part of the membrane electrode one particular size/alignment may be used, e.g. that shown in FIG. 3, but in another part of the membrane electrode a different size/alignment may be used, e.g. that shown in FIG. 4a or 4b or FIG. 5.

Figure 6:
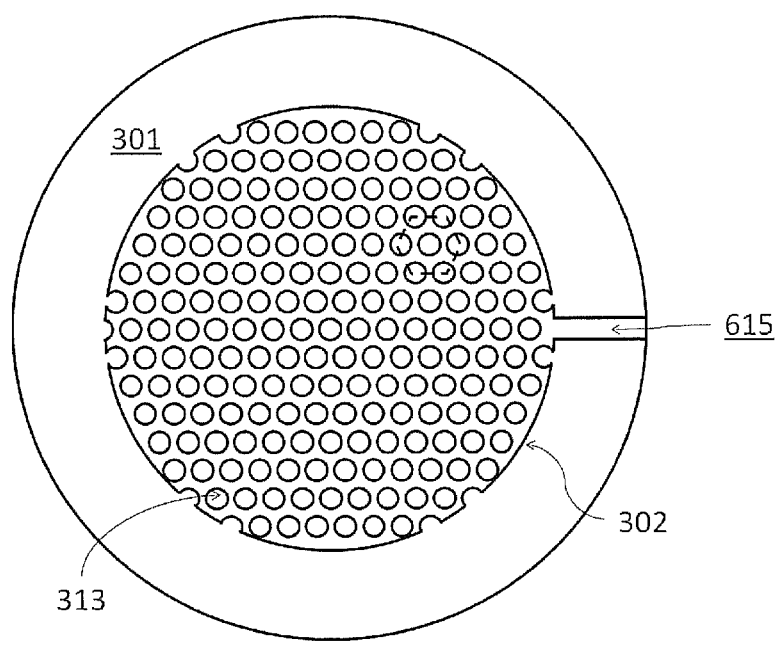
FIG. 6 illustrates a plan view of a membrane electrode according to an embodiment of the invention showing the arrangement of the openings in the membrane electrode.

FIG. 6 illustrates a plan view of the membrane 301 and membrane electrode 302 of one embodiment of a MEMS transducer. As described previously the membrane electrode 302 may be deposited over the central part of the membrane 301 and the outer boundary of the membrane electrode 302 may encompass an area of the central part of the membrane which is of the order of 40% or so of the membrane area. FIG. 6 shows the plan view of the openings 313 that are formed in the membrane electrode 302. The conductive track 615 is also shown in FIG. 6, which connects the membrane electrode 302 to the associated circuitry (not shown). The conductive track 615 is typically formed of the same material as the membrane electrode 302. The openings 313 shown in FIG. 6 form an array in a hexagonal pattern (illustrated by the dotted hexagon) within the outer boundary of the membrane electrode 302. In this embodiment there are also openings formed in the periphery, i.e. outer boundary, of the membrane electrode. These openings are not completely enclosed by membrane electrode material and, as the corresponding hole in the back-plate electrode may not fully fall within the outer boundary of the membrane electrode, the openings can vary in size depending on where they are positioned in the array.

Note as used herein the outer boundary of the membrane electrode refers to the general perimeter that the electrode there would have if there were no openings in the membrane, i.e. in this instance the outer boundary would be a generally circular perimeter. In general terms the outer boundary of the membrane electrode can be thought of as a perimeter which completely surrounds the membrane electrode and which has substantially the smallest possible length. Thus in the embodiment shown in FIG. 6 the outer boundary would follow the circular perimeter of the electrode until the mouth of an opening was reached—the outer boundary would then be a substantially straight line across the mouth of the opening, where it would then again follow the circular perimeter of the electrode. The conductive track 615 will not generally be considered part of the membrane electrode but in some instances the end of the conductive track and start of the electrode may be not be clearly defined.

It will be appreciated that the presence of openings in the membrane electrode within the outer boundary of the membrane electrode, where there are no holes in the flexible membrane, thus means that the area of flexible membrane material that lies within the outer boundary of the membrane electrode is greater than the area of material forming the membrane electrode. In some embodiments the material of the flexible membrane occupies the whole of the area within the outer boundary of the membrane electrode.

In the embodiment illustrated in FIG. 6 there is an opening in the membrane electrode associated with substantially all the acoustic holes in the back-plate that fall, at least partly within the outer boundary of the membrane electrode. In one embodiment the diameter of the openings may be of the order of about 10 µm with the shortest distance between adjacent openings being of the order of about 5 µm.

This density of openings can significantly reduce the amount of material forming the membrane electrode. Typically the outer perimeter of a membrane electrode may encompass an area of the membrane of at least 35%. For example consider a membrane electrode of a first diameter such that the outer boundary of the membrane electrode encompasses an area of about 40% of the centre of the membrane. Without any openings in the membrane electrode the coverage of the membrane by the electrode is thus about 40%. With openings of the order of about 10 µm diameter separated by about 5 µm the extent of coverage of the membrane drops to about 25% or less.

This changes the relative contributions of the membrane layer 301 and electrode 302 to the total stress of the membrane structure. In the conventional transducer having a metal, e.g. aluminium, or an alloy, e.g. Aluminium-Silicon, electrode covering about 40% of a crystalline, i.e. silicon nitride, or polycrystalline membrane, the membrane electrode 302 may contribute about one third of the total stress. By reducing the coverage of electrode material 302, in this particular case from about 40% to less than 25% for example, the stress contribution due to the membrane electrode 302 is reduced. If the intrinsic stress of the membrane 301, e.g. silicon nitride, is adjusted to compensate to provide the same overall stress the membrane electrode 302 will contribute less than 20% to the total stress.

It should be noted that FIG. 6 shows the openings 313 are discrete openings. In some embodiments however at least some openings could be linked to one another by narrow channels (not illustrated) in the membrane electrode 302.

Figure 7:
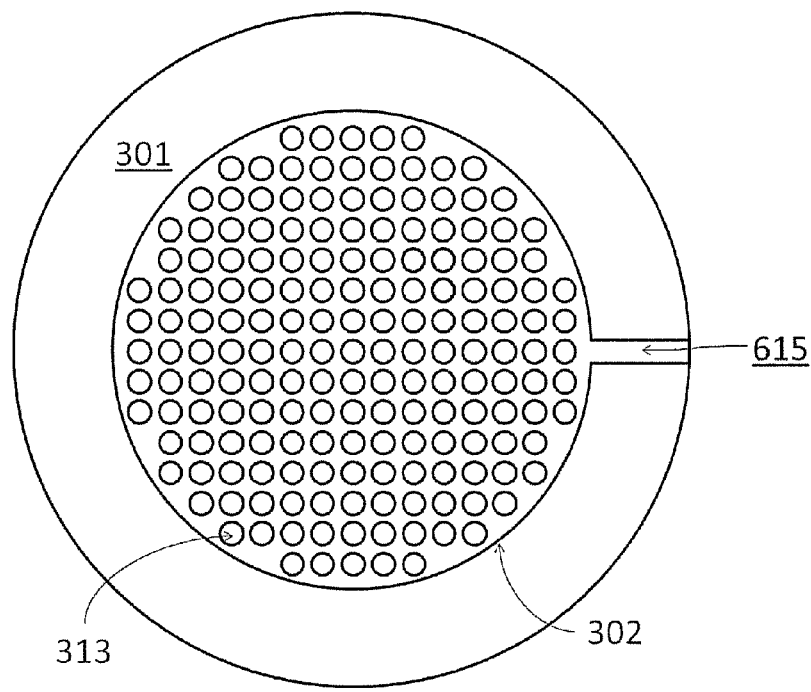
FIG. 7 illustrates another arrangement of openings in the membrane.

FIG. 7 shows an alternative pattern of openings 313, which form a rectangular pattern (again bounded by the circular membrane electrode 302). This embodiment does not have openings 313 in the periphery of the membrane electrode 302 as illustrated in FIG. 6. In other words openings 313 are only provided in the membrane electrode 302 that correspond to holes in the back-plate electrode which fall fully within the outer boundary of the membrane electrode.

Figure 8A:
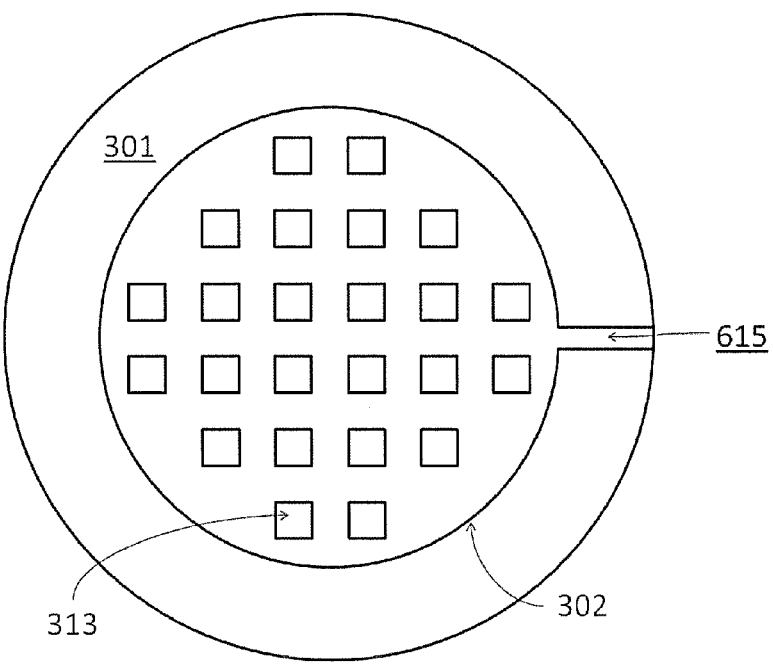
FIGS. 8a, 8b and 8c illustrate further arrangements of openings in the membrane.

FIG. 8a shows a further alternative array in openings 313, wherein the openings 313 are square in shape and are arranged in a rectangular pattern bounded by the circular membrane electrode boundary. The openings in the membrane electrode could have any desired shape as can those holes (acoustic and electrode) associated with the back-plate.

As discussed the particular arrangement of the openings 313 in the membrane electrode 302 may be chosen so at to provide a desired stress characteristic for the membrane 302/303. For instance the distribution of the plurality of openings in the membrane electrode may be configured to provide even stress as the membrane flexes. In some embodiments the arrangement of the acoustic holes may therefore be designed to match a desired pattern of openings in the membrane electrode.

Figure 8B:
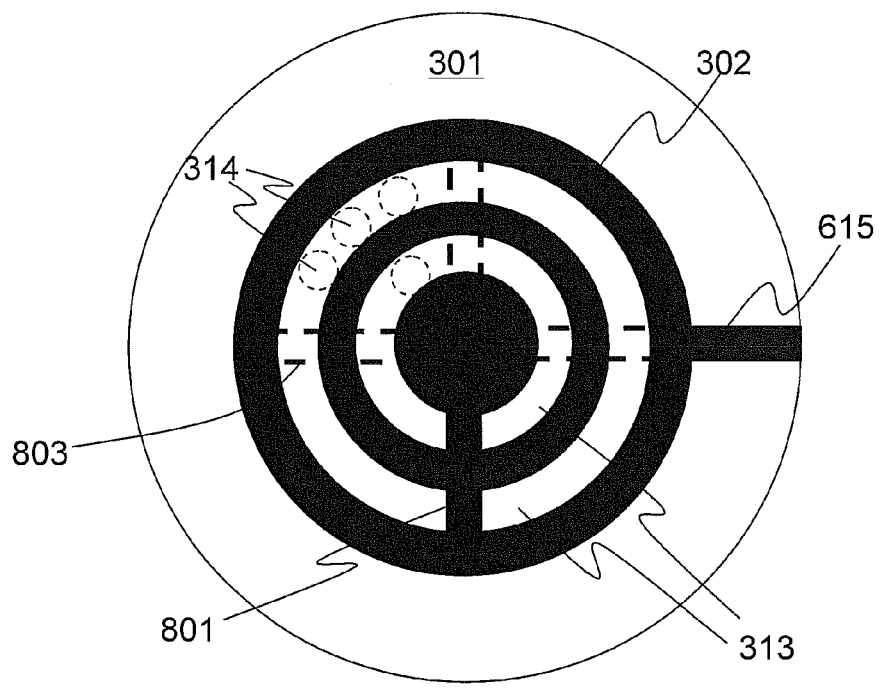
Figure 8C:
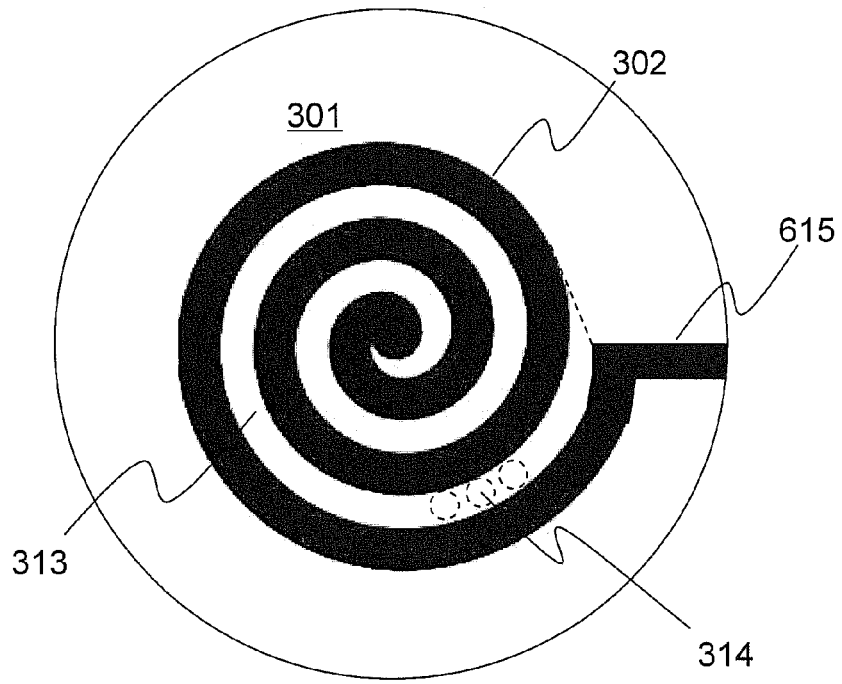

FIGS. 8b and 8c shows further examples of openings in the membrane electrode. FIG. 8b shows a plan view of flexible membrane 301 and the electrode 302 and lead track 615. In this example there are a series of arcuate openings 313 in the membrane electrode. The arcuate openings in effect divide the membrane electrode into a series of concentric annuluses and a central circular portion. As clearly the various parts of the membrane electrode must be electrically connected the arcuate opening 313 do not completely separate the membrane electrode sections and a path 801 connects all the parts of the membrane electrode. In some embodiments it may be desired that the pattern of the membrane electrode is generally symmetric (rotationally and or about an axis) and thus other paths 803 could also comprise material of the membrane electrode.

The position and size of the arcuate openings is arranged with respect to the holes 314 in the back-plate electrode so that the openings align with a number of the holes 314. The position of only a few holes 314 in the back-plate electrode are shown for clarity. In this embodiment the outer boundary of the membrane electrode will be the perimeter of the outer annular section.

FIG. 8c shows a further example in which the membrane electrode 302 has a single continuous opening 313 that spirals into the centre of the membrane electrode. Thus the resulting membrane electrode pattern resembles a spiral on the flexible membrane 301. Again the path and size of the spiral opening 313 is arranged to coincide with the area of a number of the holes 314 in the back-plate electrode. This membrane electrode is therefore relatively narrow at all points with the advantages of reduced metal creep. In this embodiment the outer boundary of the membrane electrode would run across the mouth of the spiral opening (as indicated by the dotted line) and then extend along the periphery of the electrode.

The embodiments discussed above have been described with reference to MEMS transducers where the back-plate, which supports the back-plate electrode in spaced relation to the membrane and membrane electrode, has a plurality of acoustic holes running through the back-plate. As described above the openings in the membrane electrode can be aligned with the holes in the back-plate electrode so as to reduce the amount of metal on the membrane electrode without a significant impact on capacitance.

Embodiments of the present invention also apply to transducers such as pressure sensors where the back-plate (which may form part of a substrate) is not provided with a plurality of acoustic holes. In this case there may still be a plurality of openings in the membrane electrode in embodiments of the invention. As discussed above providing openings in the membrane electrode can be advantageous in reducing the total amount of metal required as compared to a membrane electrode without openings. If the openings are relatively small, for instance of the order of a diameter of about 1 to 4 microns, there may not be a significant drop in capacitance as fringing fields from the edges of the openings in the membrane electrode will extend to the areas of the back-plate electrode where there is no linear field component. Thus the overall sensitivity of the sensor may not be significantly affected but the amount of metal and hence the extent of plastic deformation, may be decreased. Large openings could be used if desired, possibly with a small drop in sensitivity but less chance of DC offset or sensitivity changes in use.

Figure 9:
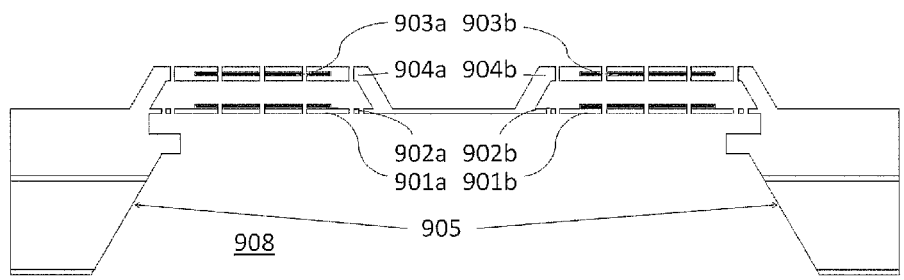
FIG. 9 illustrates an array of MEMS transducers situated in the same substrate.

FIG. 9 illustrates an embodiment wherein two transducers are formed within the same substrate 905. Two membranes (901a and 901b) are shown, each with a respective membrane electrode (902a and 902b), back-plate electrode (903a and 903b) and back-plate (904a and 904b). The back-volume 908 is therefore shared by the two transducers. These transducers could, in some embodiments, be tuned to work at different frequencies to one another. Different transducers may have different membrane and electrode properties such as size, relative areas, spacing etc. to "tune" the transducers. It is also possible that the one transducer may be an output transducer (i.e. a transmitter) and the other may be an input transducer (i.e. a receiver). FIG. 9 only shows a cross section of a possible embodiment of the present invention, in fact there could be any number of transducers in an array across the surface of the substrate. In other embodiments some or all of multiple transducers formed within the same substrate may have separate back volumes, or subsets of the transducers may each share respective back volumes. 2D array.

Figure 10:
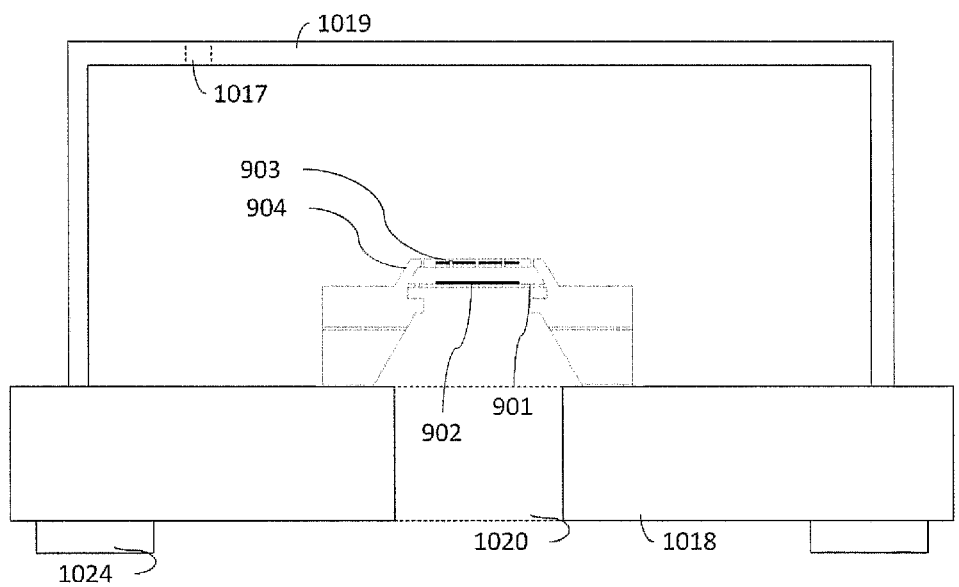
FIG. 10 illustrates a MEMS package.
Figure 11A:
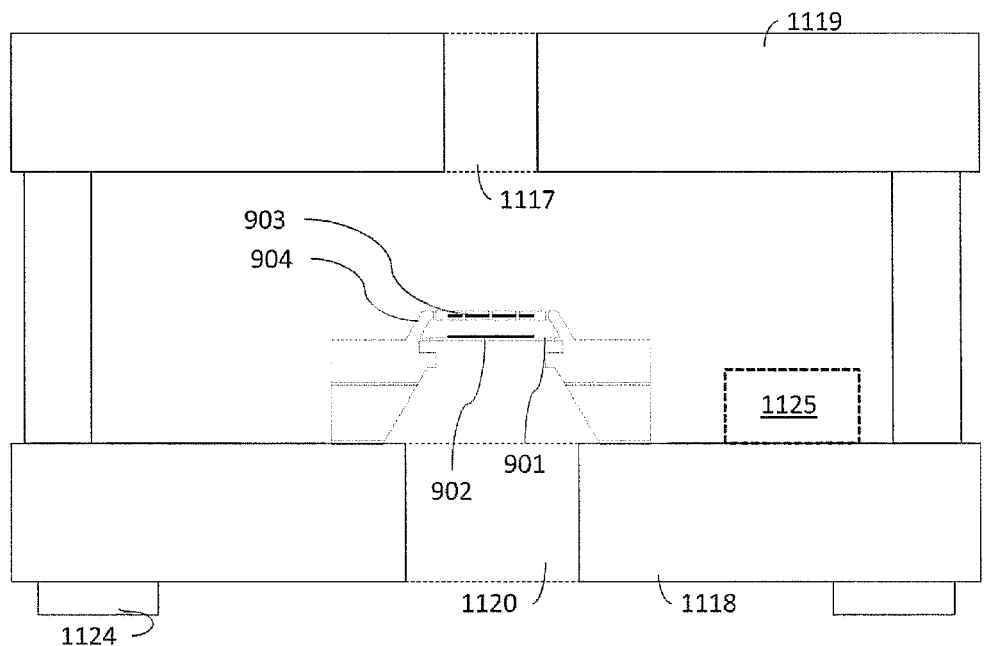
FIGS. 11a and 11b illustrate further MEMS packages.
Figure 11B:
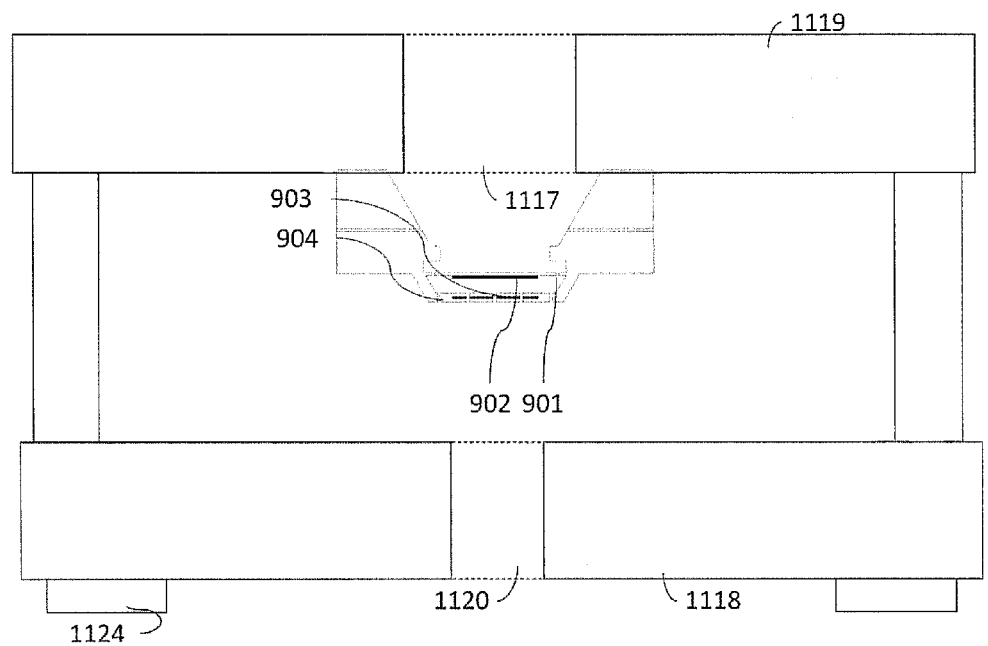

FIGS. 10, 11a and 11b illustrate embodiments of the present invention wherein the transducer is packaged, e.g. within a housing to form a MEMS package. FIG. 10 shows the transducer mounted on a (package) substrate 1018 with a protective cover or lid 1019 coupled to the substrate 1018. The cover or lid 1019 may shield the transducer, for example providing protection from electromagnetic interference and/or dust/moisture protection. In some embodiments the cover 1019 may have an acoustic port, i.e. sound hole 1017, to let pressure waves access the transducer, in which case the package substrate 1018 may be solid, thus covering the back volume formed in the substrate of the transducer (although at least part of the substrate underlying the transducer could have a cavity to increase the area of back-volume). Alternatively the transducer could be arranged with a sound port 1020 through the substrate 1018, in which case the cover 1019 may be sealed. To provide connections to the transducer and any read-out circuitry the package may have contacts 1024 connected via suitable tracks such as vias.

As shown in FIG. 11a associated integrated circuitry 1125 can also be housed within the MEMS package. The associated integrated circuitry 1125 may be directly electrically connected to the both electrodes (902 and 903) and may bias the MEMS transducer. Furthermore the associated integrated circuitry may amplify the signal produced by the incident pressure waves which cause the flexible membrane 901 to move. In the embodiment illustrated in FIG. 11a the package may be formed from a laminate type structure comprising a substrate 1118, and a cover or lid 1119 which is separated from the substrate 1118 by spacer side walls. Again the sound port could be provided in the substrate or in the cover.

FIG. 11b illustrates a further embodiment wherein the MEMS transducer is mounted on the top cover 1119 and may underlie an acoustic port 1117. In this configuration the volume between the acoustic port and the flexible membrane forms the necessary back-volume. Alternatively an acoustic port 1120 could be formed in the substrate 1118. In this configuration the substrate contacts 1124 are on the opposite substrate to the MEMS transducer, and appropriate electrical connections may need to run along the side walls of the package.

It may also be possible to mount the MEMS transducer to either side of the packaging (1018, 1019, 1118, or 1119) with the back-plate being the side which was physically attached, instead of the substrate 905.

The protective elements (1018, 1019, 1118, and 1119) serve to protect the MEMS transducer from external sources of damage. In some embodiments the package may also provide electromagnetic shielding The package, e.g. the substrate and/or cover, may be partially or fully made from a conductive material or metal. By having at least some metal (or conductive material) in the protective element a Faraday cage will be formed around the MEMS transducer keeping any external EM radiation away from the MEMS transducer. Printed circuit board material or ceramics may also be used in the fabrication of the protective elements.

Embodiments of the invention may be produced using standard MEMS processing techniques. For instance, referring back to FIG. 1a a capacitive microphone may be formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane 101, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the membrane electrode and back-plate electrode 102 and 103 is a second cavity 110.

The first cavity 109 may be formed using a first sacrificial layer during the fabrication process, i.e. using a material to define the first cavity which can subsequently be removed, and depositing the membrane layer 101 over the first sacrificial material. Formation of the first cavity 109 using a sacrificial layer means that subsequent etching of the substrate cavity 108 does not play any part in defining the diameter of the membrane. Instead, the diameter of the membrane is defined by the diameter of the first cavity 109 (which in turn is defined by the diameter of the first sacrificial layer) in combination with the diameter of the second cavity 110 (which in turn may be defined by the diameter of a second sacrificial layer). The diameter of the first cavity 109 formed using the first sacrificial layer can be controlled more accurately than the diameter of a back-etch process performed using a wet-etch or a dry-etch. Etching the substrate cavity 108 will therefore define an opening in the surface of the substrate underlying the membrane 101.

As mentioned the membrane 101 may be formed by depositing at least one membrane layer 101 over a first sacrificial material. In this way the material of the membrane layer(s) may extend into the supporting structure, i.e. the side walls, supporting the membrane. The membrane 101 may be formed by depositing one or more silicon nitride layers. The membrane layer may be dimensioned to have the required flexibility. The membrane electrode may then be deposited on the membrane layer and patterned to have a plurality of opening therein as discussed above. The membrane electrode could be patterned by depositing a metal layer in the general area required and then etching openings into the membrane or alternatively by patterning the membrane prior to deposition of the electrode material.

Collectively the metal of the membrane electrode and silicon nitride of the membrane layer provide a desired stress characteristic of the overall membrane structure. In embodiments of the present invention, where less metal is used compared to a conventional transducer, the stress of the flexible membrane layer may be greater to compensate. One skilled in the art will be aware that the stress can be controlled in various ways, such as varying the temperature of deposition.

The back-plate layer may be formed by depositing a further layer of sacrificial material to define a cavity between the membrane and back-plate and then depositing the back-plate layer(s) and back-plates electrode. The back-plate may also be formed from silicon nitride but may be deposited to be a thicker and therefore more rigid structure than the membrane. Additionally various other material layers could be used in forming the back-plate 104 to control the properties thereof. The use of a silicon nitride material system is advantageous in many ways, although other materials may be used.

In other applications the microphone may be arranged such that, some sound components may be received via the substrate cavity 108 and other sound components may be received via the back-plate 104.

The transducer shown in FIGS. 1a and b is illustrated with sloped side walls supporting the membrane layer 101 in spaced relation from the back-plate 104. Sloped or slanted side walls may be used to reduce the stress concentration. Vertical walls may be used but given the nature of the deposition process this can lead to a high stress concentration at the corners formed in the material layer that forms the membrane.

Other types of MEMS devices may make use of the embodiments described above, these include, but are not limited to pressure sensors, ultrasonic transducers, acceleration monitoring and signal generation transducers.

It is noted that the embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, laptops, mobile phones, PDAs and personal computers.

Embodiments may also be used in voice activated or voice controlled devices. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A micro-electrical-mechanical system (MEMS) transducer, comprising:
    a flexible membrane;
    a membrane electrode coupled to said flexible membrane;
    a back-plate, comprising at least one back-plate layer coupled to a back-plate electrode, the back-plate electrode having a plurality of back-plate electrode holes corresponding to a plurality of back-plate holes through the back-plate layer;
    wherein said membrane electrode comprises at least one opening in the membrane electrode, wherein the opening extends from a lower surface of the membrane electrode to an upper surface of the membrane electrode, and wherein, at least part of the area of said opening corresponds to an area of at least one back-plate hole, in a direction normal to the membrane, and there is no hole in the flexible membrane at said opening in the membrane electrode.

2. A MEMS transducer as claimed in claim 1 wherein the area of each of said holes in the back-plate electrode is greater than the area of each of said plurality of back-plate holes.

3. A MEMS transducer as claimed in claim 1 wherein said flexible membrane comprises a crystalline or polycrystalline material.

4. A MEMS transducer as claimed in claim 3 wherein said flexible membrane comprises silicon nitride.

5. A MEMS transducer as claimed in claim 1 wherein said flexible membrane has intrinsic stress.

6. A MEMS transducer as claimed in claim 1 wherein said membrane electrode comprises metal or a metal alloy.

7. A MEMS transducer as claimed in claim 6 wherein said membrane electrode comprises aluminium.

8. A MEMS transducer as claimed in claim 7 wherein said membrane electrode comprises silicon.

9. A MEMS transducer as claimed in claim 1 wherein said membrane electrode comprises a plurality of openings and, for each of said plurality of openings in the membrane electrode, at least part of the area of said opening corresponds to the area of at least one back-plate hole, in a direction normal to the membrane, and there is no hole in the flexible membrane at said opening in the membrane electrode.

10. A MEMS transducer as claimed in claim 9 wherein said at least some of said plurality of openings in the membrane electrode comprise a hole in said membrane electrode.

11. A MEMS transducer as claimed in claim 9 wherein at least some of said plurality of openings in the membrane electrode are substantially the same shape as at least some of said plurality of holes in the back-plate electrode.

12. A MEMS transducer as claimed in claim 9 wherein at least some of said plurality of openings in the membrane electrode are substantially the same size as at least some of said plurality of holes in the back-plate electrode.

13. A MEMS transducer as claimed in claim 9 wherein the area at least some of said plurality of openings in the membrane electrode align with the area of at least some of said plurality of holes in the back-plate electrode, in a direction normal to the membrane.

14. A MEMS transducer as claimed in claim 9 wherein the distribution of said plurality of openings in the membrane electrode is configured to provide even stress as the membrane flexes.

15. A MEMS transducer as claimed in claim 1 wherein less than 20% of the stress in the flexible membrane-membrane electrode structure is due to said flexible membrane.

16. A MEMS transducer as claimed in claim 1 wherein less than 25% of the surface area of said flexible membrane is covered by electrode material.

17. A MEMS transducer as claimed in claim 1 wherein the outer perimeter of the electrode encloses an area of membrane greater than 35% of the area of said membrane.

18. A MEMS transducer as claimed in claim 1 wherein said MEMS transducer is a microphone.

19. An audio device comprising a MEMS transducer as claimed in claim 1 wherein said device is at least one of: a portable device; a communications device; a computing device; a battery powered device; an audio player; a video player; a gaming device; a mobile telephone; a laptop, notebook or tablet computer.

20. A micro-electrical-mechanical system (MEMS) transducer, comprising:
    a membrane comprising at least one flexible membrane layer and a membrane electrode; and
    a back-plate having a plurality of acoustic holes therein;
    wherein said membrane electrode has a plurality of openings which extend from a lower surface of the membrane electrode to an upper surface of the membrane electrode, wherein each of the openings at least partly align with said acoustic holes and do not form part of a hole through the membrane.

21. A micro-electrical-mechanical system (MEMS) transducer, comprising:
    a flexible membrane;
    a membrane electrode coupled to said flexible membrane, wherein said membrane electrode has a plurality of membrane electrode openings, wherein the openings extend from a lower surface of the membrane electrode to an upper surface of the membrane electrode; and
    a back-plate in spaced relation to said flexible membrane; said back-plate having a plurality of back-plate holes;
    wherein said plurality of membrane electrode openings and said plurality of back-plate holes are located in substantially the same place and are substantially the same size.

* * * * *